US012803241B2

(12) United States Patent
Vitic et al.

(10) Patent No.: US 12,803,241 B2
(45) Date of Patent: Nov. 17, 2026

(54) INTEGRATED OPTICAL FREQUENCY DISCRIMINATOR

(71) Applicant: CIENA CORPORATION, Hanover, MD (US)

(72) Inventors: Michael Vitic, Chelsea (CA); James S. Harley, Richmond (CA); Tom Luk, Ottawa (CA); Antoine Bois, Québec (CA)

(73) Assignee: CIENA CORPORATION, Fulton, MD (US)

(*) Notice: Subject to any disclaimer, the term of this patent is extended or adjusted under 35 U.S.C. 154(b) by 626 days.

(21) Appl. No.: 18/474,495

(22) Filed: Sep. 26, 2023

(65) Prior Publication Data

US 2025/0105582 A1 Mar. 27, 2025

(51) Int. Cl.
*H01S 5/00* (2006.01)
*G01N 21/39* (2006.01)

(52) U.S. Cl.
CPC ........... *H01S 5/0092* (2013.01); *G01N 21/39* (2013.01)

(58) Field of Classification Search
CPC .......... H01S 5/0092; H01S 3/005; H01S 3/05; H01S 3/09; H01S 3/10; H01S 3/14; H01S 3/23; H01S 3/30; H01S 5/0014; H01S 5/005; H01S 5/02; H01S 5/04; H01S 5/06; H01S 5/10; H01S 5/20; H01S 5/30;
(Continued)

(56) References Cited

U.S. PATENT DOCUMENTS 5,991,308 A * 11/1999 Fuhrmann ............... H04J 13/00 348/E7.07
7,200,339 B1 4/2007 Roberts et al.
(Continued)

FOREIGN PATENT DOCUMENTS

CN 101277154 A * 10/2008 ........... H04B 10/508
CN 103378906 A * 10/2013 .......... H04J 14/0276
(Continued)

OTHER PUBLICATIONS

Alireza Imani et al., "An FBAR/CMOS Frequency/Phase Discriminator and Phase Noise Reduction System," May 4, 2015, IEEE Transactions on Microwave Theory and Techniques, vol. 63, No. 5, May 2015, pp. 1658-1664.*
(Continued)

*Primary Examiner* — Omar S Ismail
(74) *Attorney, Agent, or Firm* — Guntin & Gust, PLC; Kenneth S. Kwan

(57) ABSTRACT

Aspects of the subject disclosure may include, for example, a device, comprising an optical package, a frequency discriminator configured to provide complementing signals that include phase noise associated with a local oscillator (LO) input, a transimpedance amplifier (TIA) system adapted to provide one or more phase information signals by amplifying a difference of the complementing signals, and an application specific integrated circuit (ASIC) configured to process the one or more phase information signals to derive an estimation of the phase noise, wherein the frequency discriminator is implemented in the optical package and integrated with the TIA system and the ASIC to facilitate avoidance of enhanced equalized phase noise (EEPN). Other embodiments are disclosed.

20 Claims, 8 Drawing Sheets

200a

(58) Field of Classification Search
CPC .......... H01S 5/40; H01S 5/50; H01S 2301/08; H01S 2301/20; H01S 2301/18; H01S 2301/17; H01S 2301/16; H01S 2301/14; H01S 2302/02; H01S 2304/02; G01N 2001/002; G01N 21/39; G01N 2021/1757; G01N 2021/1761; G01N 21/35; G01N 21/47; G01N 21/41
See application file for complete search history.

(56) References Cited

U.S. PATENT DOCUMENTS

| | | | | |
|---|---|---|---|---|
| 7,460,793 | B2 * | 12/2008 | Taylor | H04B 10/61 398/208 |
| 7,606,498 | B1 | 10/2009 | Wu et al. | |
| 7,627,252 | B2 | 12/2009 | Sun et al. | |
| 8,886,057 | B2 * | 11/2014 | Hironishi | H04B 10/6165 398/208 |
| 11,038,599 | B1 * | 6/2021 | Oveis Gharan | H04B 10/6165 |
| 11,126,219 | B2 * | 9/2021 | Oveis Gharan | H04L 7/042 |
| 2006/0159135 | A1 * | 7/2006 | Cliche | H01S 5/0687 372/38.08 |
| 2006/0239312 | A1 * | 10/2006 | Kewitsch | H01S 5/42 372/29.016 |
| 2006/0285854 | A1 * | 12/2006 | Sun | H03L 7/085 398/155 |
| 2009/0296751 | A1 * | 12/2009 | Kewitsch | H01S 5/042 372/18 |
| 2010/0296567 | A1 * | 11/2010 | Qiu | H04W 88/02 375/340 |
| 2012/0213532 | A1 * | 8/2012 | Hironishi | H04B 10/6161 398/208 |
| 2013/0215919 | A1 * | 8/2013 | Aflatouni | H01S 5/12 372/38.08 |
| 2014/0153601 | A1 * | 6/2014 | Doerr | H01S 5/041 372/44.01 |
| 2015/0092808 | A1 * | 4/2015 | Li | H01S 3/176 438/31 |
| 2017/0222729 | A1 * | 8/2017 | Sadot | H04B 10/615 |
| 2019/0025426 | A1 * | 1/2019 | Satyan | G02B 27/30 |
| 2019/0025431 | A1 * | 1/2019 | Satyan | G02F 1/21 |
| 2020/0109988 | A1 * | 4/2020 | Sterczewski | G01N 21/45 |
| 2021/0336416 | A1 * | 10/2021 | Yoffe | G02F 1/225 |
| 2023/0083807 | A1 * | 3/2023 | Tal | G01H 9/00 704/226 |
| 2026/0197089 | A1 | 7/2026 | Gharan et al. | |
| 2026/0205204 | A1 | 7/2026 | Gharan et al. | |
| 2026/0205205 | A1 | 7/2026 | Reimer et al. | |

FOREIGN PATENT DOCUMENTS

| | | | | | |
|---|---|---|---|---|---|
| CN | 109155500 | A | * | 1/2019 | H01S 3/0057 |
| CN | 110824493 | A | * | 2/2020 | G01S 7/484 |
| CN | 111147072 | A | * | 5/2020 | H03L 7/087 |
| CN | 117882317 | A | * | 4/2024 | H04B 10/6165 |
| EP | 2979337 | B1 | * | 10/2018 | H01S 3/0816 |
| JP | 2000306340 | A | * | 11/2000 | G11B 20/10037 |
| JP | 2016506545 | A | * | 3/2016 | H03L 7/00 |
| JP | 2017050769 | A | * | 3/2017 | H04J 14/06 |
| KR | 20140059675 | A | * | 5/2014 | H01S 3/10053 |
| WO | WO-2014197780 | A1 | * | 12/2014 | H03B 17/00 |

OTHER PUBLICATIONS

Hideki Yagi et al., "InP-Based Monolithically Integrated Photonic Devices for Digital Coherent Transmission," Jul. 6, 2017, IEEE Journal of Selected Topics in Quantum Electronics, vol. 24, No. 1, Jan./Feb. 2018, pp. 1-9.*

Yuansheng Tao, "Fully On-Chip Microwave Photonic Instantaneous Frequency Measurement System," Laser Photonics Rev. 2022, 16, pp. -2200158(1-8).*

Yuxuan Tang et al., "A Low-Power SiPM Readout Front-end with Fast Pulse Generation and Successive-Approximation Register ADC in 0.18 μm CMOS," May 1, 2019, 2019 IEEE International Symposium on Circuits and Systems (ISCAS), pp. 1-3.*

Ahmed Awny et al. , "A Linear Differential Transimpedance Amplifier for 100-GB/s Integrated Coherent Optical Fiber Receivers," Sep. 28, 2017, IEEE Transactions on Microwave Theory and Techniques, vol. 66, No. 2, Feb. 2018, pp. 973-982.*

Manuel S. Neves et al.," Enhanced Phase Estimation for Long-Haul Multi-Carrier Systems Using a Dual-Reference Subcarrier Approach," May 2, 2021, Journal of Lightwave Technology, vol. 39, No. 9, May 1, 2021, pp. 2714-2722.*

Ezra Ip et al., "Coherent detection in optical fiber systems," Jan. 9, 2008, Optics Express, vol. 16, No. 2, Jan. 21, 2008, pp. 758-788.*

Khaled A. Alaghbari et al.,"Compensation of Chromatic Dispersion and Nonlinear Phase Noise Using Iterative Soft Decision Feedback Equalizer for Coherent Optical FBMC/OQAM Systems," Jul. 23, 2020, Journal of Lightwave Technology, vol. 38, No. 15, Aug. 1, 2020, pp. 3839-3842.*

Aditya Kakkar et al. , "Comprehensive Study of Equalization-Enhanced Phase Noise in Coherent Optical Systems," Nov. 1, 2015, Journal of Lightwave Technology, vol. 33, No. 23, Dec. 1, 2015, pp. 4834-4836.*

Xiang Zhou, "Efficient Clock and Carrier Recovery Algorithms for Single-Carrier Coherent Optical Systems," Feb. 12, 2014, IEEE Signal Processing Magazine, vol. 31, Issue: 2, Mar. 2014, pp. 35-42.*

Ezra Ip et al. , "Feedforward Carrier Recovery for Coherent Optical Communications," May 10, 2007 , Journal of Lightwave Technology, vol. 25, No. 9, Sep. 2007,pp. 2675-2684.*

Ezra Ip et al. , "Fiber Impairment Compensation Using Coherent Detection and Digital Signal Processing," Feb. 3, 2010, Journal of Lightwave Technology, pp. 502-515.*

Sebastian Jung et al., "Mitigating Equalization-Enhanced Phase Noise Using Adaptive Post Equalization," Mar. 17, 2025, ECOC 2024; 50th European Conference on Optical Communication, pp. 942-944.*

Lei Li et al., "Nonlinear Polarization Crosstalk Canceller for Dual-Polarization Digital Coherent Receivers," Mar. 21-25, 2010, Optical Fiber Communication Conference 2010, OSA / OFC/ NFOEC 2010, pp. 1-3.*

WenTing Wang et al., "Photonic-Assisted Wideband Phase Noise Analyzer Based on Optoelectronic Hybrid Units," Jun. 22, 2016, Journal of Lightwave Technology, vol. 34, No. 14, Jul. 15, 2016, pp. 3425-3430.*

Gunnar Jacobsen et al., "Study of EEPN mitigation using modified RF pilot and Viterbi-Viterbi based phase noise," May 13, 2013, Optics Express, vol. 21, No. 10.pp. 12352-12361.*

"OIF 1600ZR+ EEPN Considerations oif2024.617.00", including mentions of Meng et al. "Mitigation of Equalization Enhanced Phase Noise Using Feed-forward Timing Error Correction" and Jung et al. "Mitigating Equalization—Enhanced Phase Noise Using Adaptive Post Equalization", Nov. 5-7, 2024, 12 pages.

Abolfathimomtaz, Abbas , et al., "Equalization-Enhanced Phase Noise Compensation in Coherent Fiber Receivers", Journal of Lightwave Technology, vol. 42, No. 20, Oct. 15, 2024, 12 pages.

Belfiore, Carlos A., et al., "Decision Feedback Equalization", Proceedings of the IEEE, vol. 67, No. 8, Aug. 1979, 14 pages.

Elliott, Stephen J., et al., "Performance of feedforward and feedback systems for active control", IEEE Transactions on Speech and Audio Processing, vol. 4, No. 3, May 1996, 10 pages.

Ip, Ezra , et al., "Coherent Detection in Optical Fiber Systems", Optics Express 753, vol. 16, No. 2, Jan. 21, 2008, 40 pages.

Ip, Ezra, et al., "Feedforward Carrier Recovery for Coherent Optical Communications", Journal of Lightwave Technology, vol. 25, No. 9, Sep. 2007, 18 pages.

Ip, Ezra M., "Fiber Impairment Compensation Using Coherent Detection and Digital Signal Processing", Journal of Lightwave Technology, vol. 28, No. 4, 2010, 18 pages.

Jacobsen, Gunnar , et al., "Study of EEPN mitigation using modified RF pilot and Viterbi-Viterbi based phase noise compensation", Optics Express, 2013, 12 pages.

Jung, Sebastian , et al., "Mitigating Equalization-Enhanced Phase Noise Using Adaptive Post Equalization", ECOC 2024, 2024, 4 pages.

(56) References Cited

OTHER PUBLICATIONS

Kakkar, Aditya, et al., "Comprehensive Study of Equalization-Enhanced Phase Noise in Coherent Optical Systems", Journal of Lightwave Technology, vol. 33, No. 23, Dec. 1, 2015, 8 pages.
Neves, Manuel S., et al., "Enhanced Phase Estimation for Long-Haul Multi-Carrier Systems Using a Dual-Reference Subcarrier Approach", Journal of Lightwave Technology, vol. 39, No. 9, May 1, 2021, 11 pages.
Qiu, Meng , et al., "Mitigation of Equalization Enhanced Phase Noise Using Feed-forward Timing Error Correction", ECOC, 2024, 4 pages.
Zhou, Xiang , "Efficient Clock and Carrier Recovery Algorithms for Single-Carrier Coherent Optical Systems: A systematic review on challanges and recent progress", IEEE Signal Processing Magazine, vol. 31, No. 2, Mar. 2014, 11 pages.
Colavolpe, Giulio , et al., "Impact of Phase Noise and Compensation Techniques in Coherent Optical Systems", Journal of Lightwave Technology, vol. 29, No. 18, Sep. 15, 2011, 11 pages.
Kakkar, Aditya , et al., "Overcoming EEPN in Coherent Transmission Systems", 2016 Optical Society of America, downloaded Jul. 18, 2023, 2 pages.
Li, et al., "Nonlinear Polarization Crosstalk Canceller for Dual-Polarization Digital Coherent Receivers", OSA/OFC/NFOEC 2010; Downloaded from IEEEXplore Mar. 21, 2025, 2010, 3 pages.

* cited by examiner

100

200a

200b $$i_P(t) = \frac{R_P}{2}|E_L|^2 + \frac{P_L R_P}{2}\sin(\theta(t-\tau) - \theta(t))$$

$$i_N(t) = \frac{R_N}{2}|E_L|^2 - \frac{P_L R_N}{2}\sin(\theta(t-\tau) - \theta(t))$$

214

220

230

230'

INTEGRATED OPTICAL FREQUENCY DISCRIMINATOR

FIELD OF THE DISCLOSURE

The subject disclosure relates to integration of an optical frequency discriminator in an intradyne coherent receiver (ICR) or a transmit receive optical silicon integrated circuit (TROSIC).

BACKGROUND

As technology advances, high performance optical fiber transmission systems continue to evolve with higher bauds and more complex modulation formats.

BRIEF DESCRIPTION OF THE DRAWINGS

Reference will now be made to the accompanying drawings, which are not necessarily drawn to scale, and wherein.

DETAILED DESCRIPTION

Figure 1:
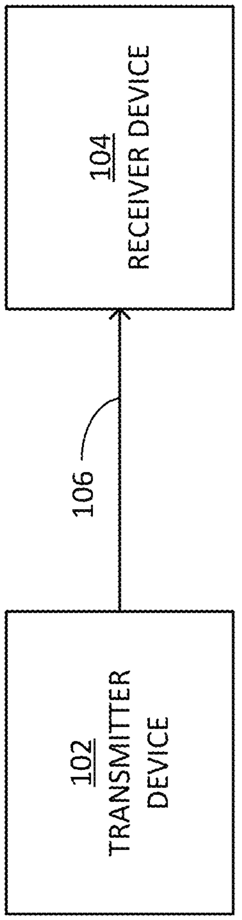
FIG. 1 is a diagram of a non-limiting example of a communication network in accordance with various aspects described herein.

With evolving high performance optical fiber transmission systems, equalization-enhanced phase noise (EEPN)-induced distortions become more significant for a given local oscillator (LO) linewidth. As a result of the degradations, tradeoffs may generally need to be made within an achievable systems budget (required optical signal to noise ratio (rOSNR) or dispersion tolerance). One technique to compensate for higher baud or constellation complexity is to utilize lower linewidth lasers (<100 kilohertz (kHz)), such as external cavity nano Integrated Tunable Laser Assembly (ITLA) lasers. However, low linewidth lasers generally use a complex free space optical arrangement of thermally tuned etalons and verniers, which require an extremely high quality factor of the optical cavity. Furthermore, using LOs with <300 kHz linewidths also requires additional components, such as integrated ring resonators or distributed Bragg gratings.

The subject disclosure describes illustrative embodiments of a coherent receiver (e.g., a silicon photonics (SiP) ICR or micro ICR (μICR)) or an optical transceiver (e.g., a TROSiC) that is integrated with an extracted phase noise (EPN) interferometer. In various embodiments, an output of the EPN interferometer may be amplified and digitized to detect the incremental phase of an LO receiver (Rx) laser in the ICR or a shared LO transmit (Tx)/Rx laser in the TROSiC. Integration of the EPN interferometer allows for estimation of the phase, which can be applied to the phase of a digital signal prior to digital signal processing (e.g., digital dispersion compensation, etc.). In one or more embodiments, a (e.g., balanced) transimpedance amplifier (TIA) may also be integrated in (e.g., flip-chipped onto) the ICR/TROSiC, and may be adapted with a difference and/or sum amplifier for amplifying the EPN and/or relative intensity noise (of a laser). In certain embodiments, an Rx application specific integrated circuit (ASIC) may further be integrated with the ICR/TROSiC, and may be adapted with additional analog to digital converters (ADCs) for obtaining the difference and/or sum signals from the TIA and estimating/applying the extracted phase and/or relative intensity noise for cancellation.

Embodiments of the (e.g., monolithic) integration of the EPN interferometer in an ICR/TROSiC along with supporting structures or components (such as balanced photodetectors, the TIA (or EPN receiver), and high speed (e.g., 1 Giga sample/second (GSs)) ADC(s)) advantageously mitigate or eliminate EEPN impairment(s) that can otherwise occur from the interaction of the LO's phase and Rx-based digital dispersion compensation. Utilizing a more integrated (e.g., silicon) receiver/transceiver package, as described herein, allows for the use of LOs with much larger linewidths (e.g., 500+ kHz) without incurring much (if any) system penalty. This also offers simpler and lower loss optical trains, which reduces cost and improves overall performance.

One or more aspects of the subject disclosure include a device, comprising an optical package, a frequency discriminator configured to provide complementing signals that include phase noise associated with a local oscillator (LO) input, a transimpedance amplifier (TIA) system adapted to provide one or more phase information signals by amplifying a difference of the complementing signals, and an application specific integrated circuit (ASIC) configured to process the one or more phase information signals to derive an estimation of the phase noise, wherein the frequency discriminator is implemented in the optical package and integrated with the TIA system and the ASIC to facilitate avoidance of enhanced equalized phase noise (EEPN).

One or more aspects of the subject disclosure include noise cancellation system for integration with an optical package to facilitate avoidance of enhanced equalized phase noise (EEPN), the noise cancellation system comprising a frequency discriminator configured to provide complementing signals that include phase noise associated with a local oscillator (LO) input, a transimpedance amplifier (TIA) system adapted to provide one or more phase information signals by amplifying a difference of the complementing signals, and an application specific integrated circuit (ASIC) configured to process the one or more phase information signals to derive an estimation of the phase noise, wherein the frequency discriminator is implemented in the optical package and integrated with the TIA system and the ASIC.

One or more aspects of the subject disclosure include a method, comprising implementing a frequency discriminator in an optical package, the frequency discriminator being configured to provide complementing signals that include phase noise associated with a local oscillator (LO) input, and integrating a transimpedance amplifier (TIA) system and an application specific integrated circuit (ASIC) with the frequency discriminator to facilitate avoidance of enhanced equalized phase noise (EEPN), wherein the TIA system is adapted to provide one or more phase information signals by amplifying a difference of the complementing signals, and wherein the ASIC is configured to process the one or more phase information signals to derive an estimation of the phase noise.

FIG. 1 is a diagram of a non-limiting example of a communication network 100 in accordance with various aspects described herein. The communication network 100 may include at least one transmitter device 102 and at least one receiver device 104. The transmitter device 102 may be capable of transmitting signals over a communication channel, such as a communication channel 106. In one or more embodiments, the transceiver 102 may be a modem. The receiver device 104 may be capable of receiving signals over a communication channel, such as the communication channel 106. In various embodiments, the transmitter device 102 may also be capable of receiving signals and/or the receiver device 104 may also be capable of transmitting signals. Thus, one or both of the transmitter device 102 and the receiver device 104 may be capable of acting as a transceiver.

The communication network 100 may include additional elements not shown in FIG. 1. For example, the communication network 100 may include one or more additional transmitter devices, one or more additional receiver devices, and one or more other devices or elements (e.g., active optical devices (such as optical amplifiers) and/or passive devices (such as multiplexer(s), demultiplexer(s), fiber(s), etc.)) involved in the communication of signals in the fiber-optic communication network 100.

In some embodiments, the signals that are transmitted and received in the communication network 100 may include optical signals and/or electrical signals. For example, the transmitter device 102 may be a first optical transceiver, the receiver device 104 may be a second optical transceiver, and the communication channel 106 may be an optical communication channel. In certain embodiments, one or both of the first optical transceiver and the second optical transceiver may be a coherent modem.

In various embodiments, each optical communication channel in the communication network 100 may include one or more links, where each link may include one or more spans, and where each span may include a length of optical fiber and one or more optical amplifiers. Where the communication network 100 involves the transmission of optical signals, the communication network 100 may include additional optical elements not shown in FIG. 1, such as wavelength selective switches, optical multiplexers, optical demultiplexers, optical filters, and/or the like.

Various elements and effects in an optical link between two communicating devices may result in the degradation of transmitted signals. That is, optical signals received over optical links can become distorted. Particularly, these signals may suffer from polarization mode dispersion (PMD), polarization dependent loss or gain (PDL or PDG), state of polarization (SOP) rotation, amplified spontaneous emission (ASE) noise, wavelength-dependent dispersion or chromatic dispersion (CD), nonlinear noise from propagation through fiber, and/or other effects. For instance, polarization effects of a fiber link tend to rotate the transmitted polarizations such that, at the receiver, they are neither orthogonal to each other nor aligned with the polarization beam splitter of the optical hybrid. As a result, each of the received polarizations (e.g., downstream of the polarization beam splitter) may contain energy from both of the transmitted polarizations, as well as distortions due to CD, PMD, PDL, etc. These problems may be compounded for polarization-division multiplexed signals in which each transmitted polarization contains a respective data signal. The degree of signal degradation due to noise and nonlinearity may be characterized by a signal-to-noise ratio (SNR) or, alternatively, by a noise-to-signal ratio (NSR). The signals transmitted in the communications network may be representative of digital information in the form of bits or symbols. The probability that bit estimates recovered at a receiver differ from the original bits encoded at a transmitter may be characterized by the Bit Error Ratio (BER). As the noise power increases relative to the signal power, the BER may also increase.

Figure 2A:
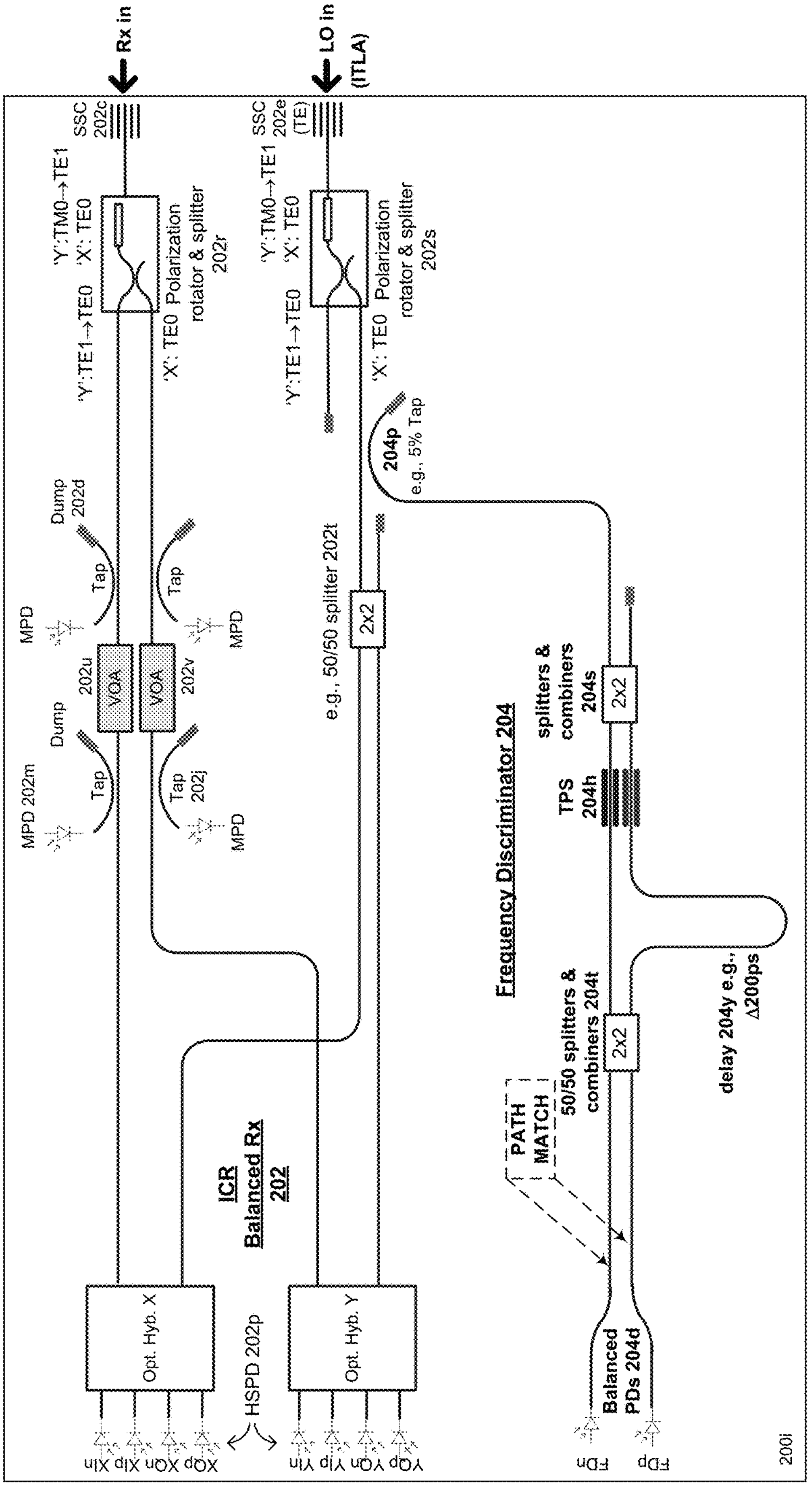
FIG. 2A illustrates an example ICR that is equipped with a frequency discriminator in accordance with various aspects described herein.

FIG. 2A illustrates an example ICR 200*a* that is equipped with a frequency discriminator in accordance with various aspects described herein. As shown in FIG. 2A, the ICR 200*a* may be implemented on a die 200*i* (e.g., composed of silicon and/or other type of semiconductive material), and may include a balanced receiver 202 and a frequency discriminator 204. Subscripts P (or p) and N (or n) are used herein to refer to balanced components (e.g., photodetectors, etc.) of the receiver 202 and the frequency discriminator 204, where, in two branches, there are non-inverting (P or p) and inverting (N or n) portions of light (e.g., in a push-pull configuration), resulting in a differential signal with a reduced or eliminated common mode that would otherwise be present on the two branches. In various embodiments, the ICR 200*a* and/or the balanced receiver 202 thereof may be the same as or similar to (or otherwise correspond to) the receiver 104 of FIG. 1, and may be configured to receive an optical signal (Rx in), which may comprise a degraded version of an optical signal generated by a transmitter device (e.g., the transmitter device 102 of FIG. 1). The optical signal generated by the transmitter device may be representative of information bits (also referred to as client bits) which are to be communicated to the balanced receiver 202. The optical signal generated by the transmitter device may be representative of a stream of symbols. According to some examples, the transmitter device may be configured to apply forward error correction (FEC) encoding to the client bits to generate FEC-encoded bits, which may then be mapped to one or more streams of data symbols. The optical signal transmitted by the transmitter device may be generated using any of a variety of techniques, such as frequency division multiplexing (FDM), polarization-division multiplexing (PDM), single polarization modulation, modulation of an unpolarized carrier, mode-division multiplexing, spatial-division multiplexing, Stokes-space modulation, polarization balanced modulation, wavelength division multiplexing (WDM) (where a plurality of data streams is transmitted in parallel, over a respective plurality of carriers, and where each carrier is generated by a different laser), and/or the like.

As shown in FIG. 2A, the ICR 200*a* may include a spot-size converter (SSC) 202*c* for coupling optical signals (Rx in) received via one waveguide or in one optical mode into another. The ICR 200*a* may also (e.g., optionally) include a polarization rotator/splitter 202*r* for adjusting/splitting Rx in into polarized components. The ICR 200*a* may further include a SSC 202*e* for coupling a LO signal (LO in) received via one waveguide or in one optical mode into another. In some embodiments, LO in may be produced by an ITLA, an external cavity laser, etc. The ICR 200*a* may also include a polarization rotator/splitter 202*s* for adjusting/splitting LO in into polarized components as well. Transverse Electric (TE) and Transverse Magnetic (TM) modes are electromagnetic wave modes in which the orientation of the electric and magnetic fields are different with respect to the direction of propagation. TE modes have electric fields that are perpendicular to the direction of propagation, whereas TM modes have magnetic fields that are perpendicular to the direction of propagation. In certain embodiments, the optical modes of Rx in and LO in may be converted as shown (e.g., by stripping away TM so that only TE is guided).

According to one example implementation, the polarized components may include orthogonally polarized components corresponding to an X polarization and a Y polarization. The ICR 200*a* may include various components that couple/lead to an optical hybrid coupler X for the X polarization and an optical hybrid coupler Y for the Y polarization. These components may include variable optical attenuators (VOAs) 202*u*, 202*v* for the X. Y polarizations (for adjusting optical power levels), taps 202*j* (for extracting portions of optical signals for monitoring/diagnostic purposes), dumps 202*d* (as termination points for optical signals that are no longer needed), monitoring photodetectors (MPD) 202*m* (for monitoring extracted portions of optical signals), and a splitter (e.g., 50/50 splitter) 202*t*, as shown.

Photodetectors 202*p* (which may be high-speed photodetectors) may be configured to convert the optical signals output by the optical hybrids X. Y to analog electrical signals for processing by an Rx ASIC (not shown in FIG. 2A). The frequency difference between the Rx laser and the Tx laser is the Intermediate Frequency, and an offset of that away from nominal can be called fIF. According to one example implementation, the analog signals may include signals corresponding, respectively, to the dimensions XI and XQ ($XI_p$, $XI_n$, $XQ_p$, $XQ_n$) and YI and YQ ($YI_p$, $YI_n$, $YQ_p$, $YQ_n$), where XI and XQ denote the in-phase and quadrature components of the X polarization, and YI and YQ denote the in phase and quadrature components of the Y polarization.

In exemplary embodiments, the frequency discriminator 204 may be an interferometer that includes various components for detecting the incremental phase of the LO laser. As shown in FIG. 2A, the frequency discriminator 204 may include a tap coupler 204*p* (e.g., a 5% tap or thereabouts, as any greater would divert too much light from the balanced receiver 202) to split a small amount of the light from LO in. The frequency discriminator 204 may also include splitter(s) (e.g., a near 50%/50% splitter, such as a 2×2 multi-mode interferometer (MMI), a directional coupler, a Y-branch, etc.) for splitting the optical path into two paths for the interferometer, a single or pair of thermal phase shifters (TPSs) 204*h* or other types of phase shifters, an optical delay 204*y* (e.g., about 200 picoseconds) in one path relative to the other path, combiners/splitters 204*t* (e.g., where straight and crossed outputs may be used, and again where the coupler may be a 2×2 MMI, a directional coupler, a Y-branch, etc.), and a pair of photodetectors 204*d*, which may be either individual, totem connected (common cathode/anode) or balanced (common cathode). The configuration of the frequency discriminator 204 may facilitate “beating” of the light between the main path and the delayed path, which, based on the delay length, results in a beating of the light at a given frequency with associated phase noise. As described in more detail below, the frequency discriminator 204 may be integrated with other devices to estimate the detected phase noise and use it to (partially or fully) cancel EPN in the (e.g., digital) signal prior to performing digital dispersion compensation and/or other processing.

For (e.g., optimal or improved) power balancing on the photodetectors 204*d*, the splitter 204*s* in the optical path of the interferometer may be chosen to have a 50/50 ratio or a different ratio (e.g., 52/48, etc.). Assuming lossless couplers, where the cross-ratio of the first and second couplers 204*s* and 204*t* are presented as $0 \le c_1 \le 1$ and $0 \le c_2 \le 1$, respectively, where transmission of the lossy delay path is represented as $0 \le \alpha \le 1$, and where the other path (without the delay) is normalized to unity, ideal balancing may achieved with $c_1(1-c_2)\alpha+(1-c_1)c_2-c_1c_2\alpha-(1-c_1)(1-c_2)=0$. Rewritten as a pair of intersecting lines $(-\alpha c_1-c_1+1)(2c_2-1)=0$, the solution for the balancing may be $c_1=1/(\alpha+1)$ and $c_2=\frac{1}{2}$(i.e., 50/50).

Figure 2B:
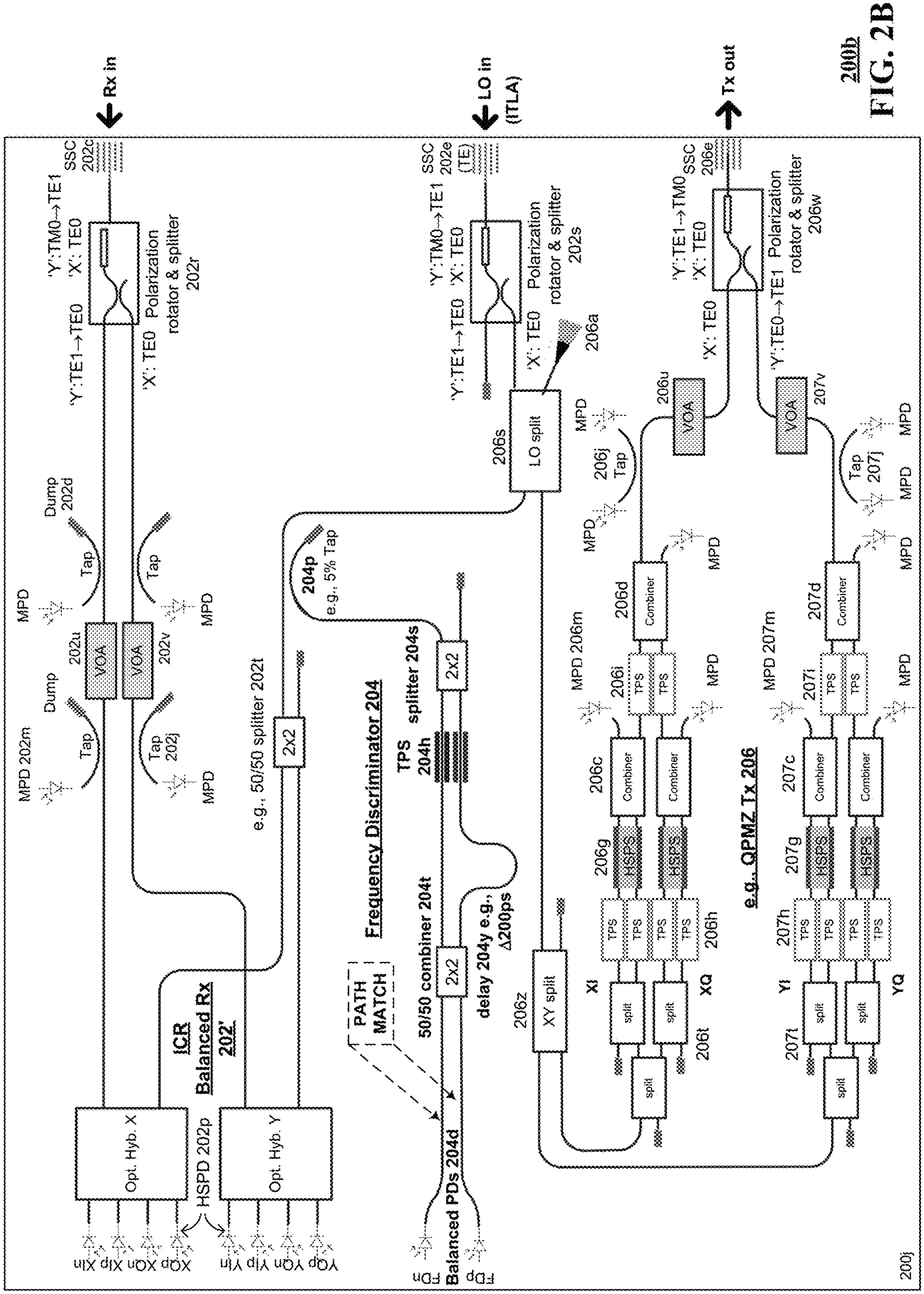
FIG. 2B illustrates an example optical Tx/Rx (transceiver) that is equipped with a frequency discriminator in accordance with various aspects described herein.

FIG. 2B illustrates an example optical Tx/Rx (transceiver) 200*b* that is equipped with a frequency discriminator in accordance with various aspects described herein. In exemplary embodiments, the transceiver 200*b* may be implemented on a die 200*j*—e.g., as a TROSiC SiP chip or package. As shown in FIG. 2B, the transceiver 200*b* may include an instance of the frequency discriminator 204 described above with respect to FIG. 2A. Further, the transceiver 200*b* may include a balanced receiver 202', which may be similar to or otherwise correspond to the balanced receiver 202 of FIG. 2A. The difference here is that the LO signal is split between the balanced receiver 202' and a transmitter portion 206. In various embodiments, the transmitter portion 206 may be the same as or similar to (or otherwise correspond to) the transmitter 102 of FIG. 1, and may be configured to transmit an optical signal (Tx out) to a receiver.

The transmitter portion 206 may employ nested Mach-Zehnder (MZ) architecture(s)—i.e., two dual-parallel MZs (DPMZs), each with two inner MZs and one outer MZ—resulting in a quad parallel MZ (QPMZ) modulator. In one or more embodiments, the optical modulator system may be equipped to control four quadrature data signals (i.e., radio frequency (RF) XI, RF XQ, RF YI, RF YQ signals) via a Tx ASIC (not shown in FIG. 2B). Although not shown, in certain embodiments, a single DPMZ (rather than a QPMZ) may be utilized, resulting in a 4-amplitude shift keying (ASK) modulation format for the transmitter portion.

The QPMZ modulator may include an XI modulator, an XQ modulator, and an outer phase modulator (respectively functioning as two inner MZs nested within an outer MZ for the X polarization) as well as a YI modulator, a YQ modulator, and an outer phase modulator (respectively functioning as two inner MZs nested within an outer MZ for the Y polarization). Each MZ may have one or two DC electrodes depending on the implementation of the MZ.

As shown in FIG. 2B, the transmitter portion 206 may obtain a split optical (e.g., laser) signal from an LO splitter 206*s* (which may be coupled to a grating coupler 206*a*) for feeding into parallel sets of components in the QPMZ architecture. The laser input may be divided (e.g., via a beam splitter 2062) into X and Y polarizations, where the X polarization may be further divided into an optical I input that is fed into an X-pol I-arm (i.e., the XI modulator) and an optical Q input that is fed into an X-pol Q-arm (i.e., the XQ modulator), and where the Y polarization may be further divided into an optical I input that is fed into a Y-pol I-arm (i.e., the YI modulator) and an optical Q input that is fed into a Y-pol Q-arm (i.e., the YQ modulator). The QPMZ modulator 206 may be capable of independently generating orthogonal optical electric field components (I channel and Q channel) for each polarization X and Y, according to various types of multi-value modulation methods, such as N-quadrature amplitude modulation (QAM), differential quadrature phase shift keying (D-QPSK), etc. The outputs of the QPMZ modulator arms may be fed for polarization rotation/splitting via a polarization rotator/splitter 206_w_ for final output as Tx out. In various embodiments, the parallel sets of QPMZ components may include splitters 206_t_, 207_t_, TPSs 206_h_, 207_h_, phase shifters (e.g., high-speed phase shifters) 206_g_. 207_g_, combiners 206_c_, 207_c_, TPSs 206_i_, 207_i_, combiners 206_d_. 207_d_, VOAs 206_u_, 207_v_, MPDs 206_m_, 207_m_, and taps 206_j_, 207_j_, as shown.

Figure 2C:
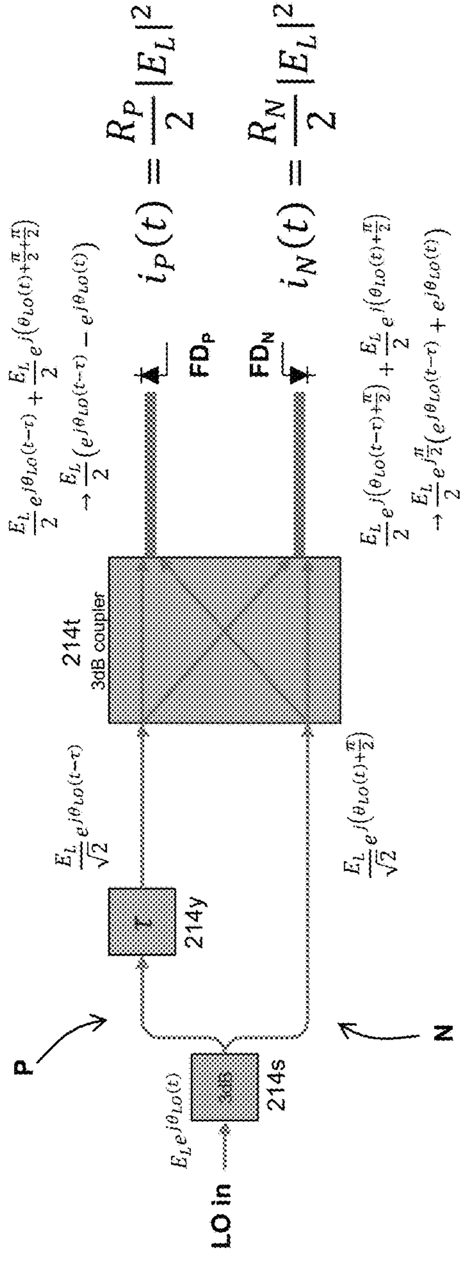
FIG. 2C is a block diagram of an example implementation of a frequency discriminator in accordance with various aspects described herein.

FIG. 2C is a block diagram of an example implementation of a frequency discriminator 214 in accordance with various aspects described herein. In various embodiments, the frequency discriminator 214 shown in FIG. 2C may be the same as or similar to (or otherwise correspond to) any of the frequency discriminators 204 described above with respect to FIGS. 2A and 2B. Referring to FIG. 2C, the frequency discriminator 214 may include a (e.g., 3 decibel (dB)) coupler 214_s_ that receives a tapped portion of LO in, a delay 214_y_ on one path 'P' (with no similar delay in another path 'N'), and a (e.g., 3 dB) coupler 214_t_ that leads to two photodetectors $FD_P$ and $FD_N$. Equations for current $i_P(t)$ and $i_N(t)$ are shown in relation to phase θ. $E_L$ refers to the optical electric field of LO in, $R_P$ refers to the responsivity of the photodetector $FD_P$, $R_N$ refers to the responsivity of the photodetector $FD_N$, and $P_L$ refers to the optical power of LO in. Responsivity of a photodetector is a measure of optical input (optical power in Watts) to electrical output (in Amperes).

In certain embodiments, the frequency discriminator 214 may be provided based on an assumption that phase is matched (and thus TPS(s) may or may not be needed). Thus, the frequency discriminator 214 may be considered an "ideal" interferometer configuration. In any case, the benefit of having separate analogue and digital P and N paths (two single-ended paths) is that the amplitude noise information (or relative intensity noise of the laser) and phase noise information may be preserved. The difference signal P−N (which a difference amplifier (described below) can output) provides the phase information, $\sin(\theta(t-\tau)-\theta(t))$, and rejects the amplitude noise information. $|E_L|^2$. The sum signal P+N (which a sum amplifier (described below) can output) provides the amplitude noise information. $|E_L|^2$, and rejects the phase information, $\sin(\theta(t-\tau)-\theta(t))$. The difference and/or the sum signals can then be used to cancel EPN and/or relative intensity noise prior to performing certain digital signal processing, such as digital dispersion compensation.

Figure 2D:
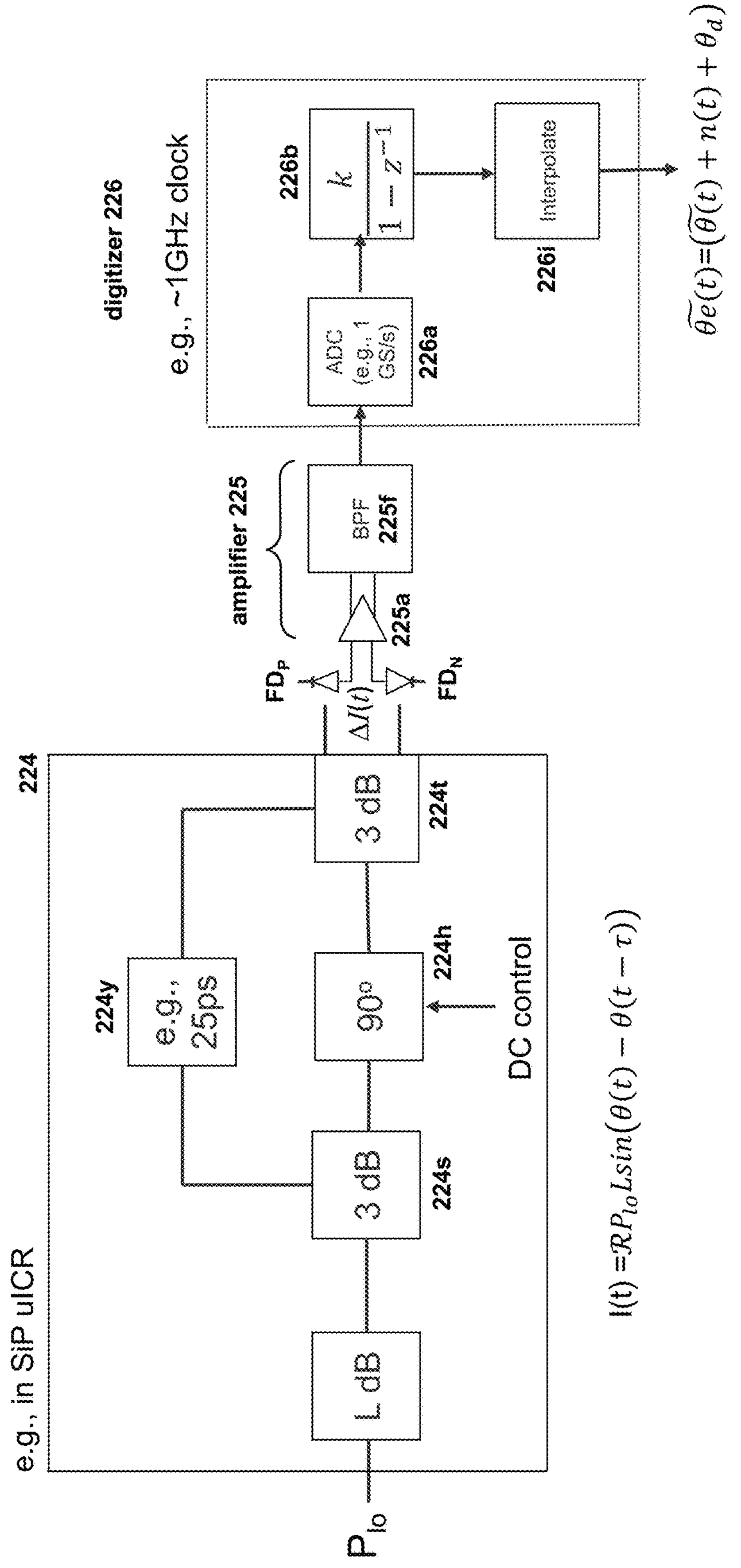
FIG. 2D is a block diagram of an example laser differential phase detection circuit in accordance with various aspects described herein.

FIG. 2D is a block diagram of an example laser differential phase detection circuit 220 in accordance with various aspects described herein. As shown in FIG. 2D, the laser differential phase detection circuit 220 may include a frequency discriminator 224, an amplifier 225, and a digitizer 226. In various embodiments, the frequency discriminator 224 may be the same as or similar to (or otherwise correspond to) any of the frequency discriminators 204 described above with respect to FIGS. 2A and 2B. The frequency discriminator 224 may include a block that receives an LO in (here $P_{lo}$, where P represents power), a coupler 224_s_, a (e.g., 90 degree) TPS 224_h_, a delay 224_y_, and a coupler 224_t_. Photodetectors $FD_P$ and $FD_N$ may receive outputs of the frequency discriminator 224 (i.e., detected phase) for amplification by the amplifier 225, which may include (e.g., difference and/or sum) amplifier device(s) 225_a_ and a band-pass filter (BPF) 225_f_. The amplified phase (for difference) and/or amplified relative intensity noise (for sum) may be digitized by the digitizer 226, which may include an analog to digital converter (ADC) 226_a_, a delay block 226_b_, and an interpolator function 226_i_. In various embodiments, the interpolator function 226_i_ may extract the phase noise and/or relative intensity noise and subtract some or all of these noise(s) from digitally-converted received signals, thereby reducing or eliminating EPN and/or relative intensity noise prior to equalization (such as chromatic dispersion compensation and so forth). Lin equation I(t) shown in FIG. 2D is the optical path loss measured in dB from input ($P_{lo}$) to the photodetectors, $FD_P$ and $FD_N$. The equation I(t) is written assuming that the optical path loss from $P_{lo}$ to $FD_P$ and from $P_{lo}$ to $FD_N$ are the same. The equation I(t) represents the difference current, delta I(t), of the $FD_P$ output and the $FD_N$ output—that is, $I(t)=I\_FD_P(t)-I\_FD_N(t)$.

Figure 2E:
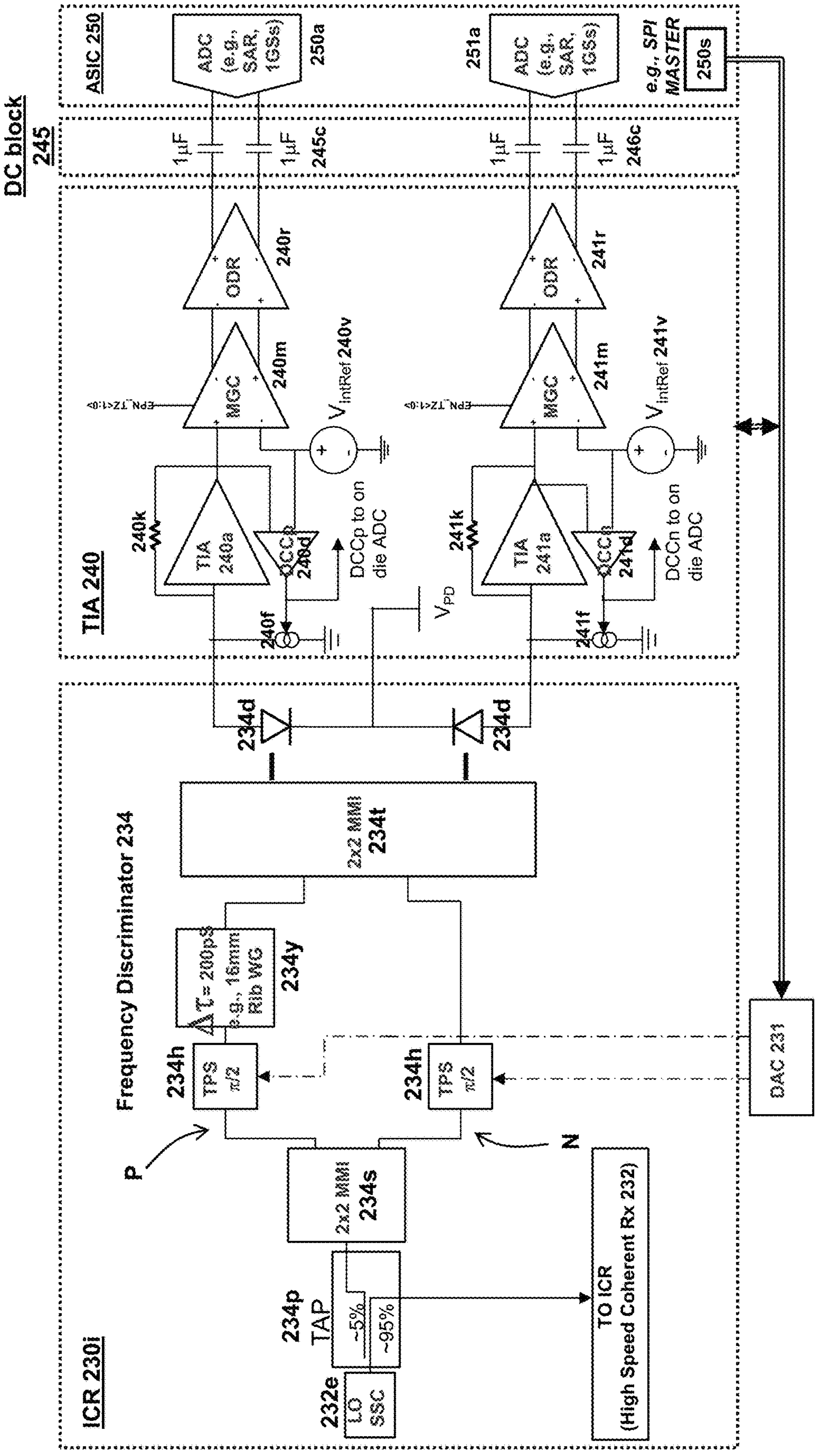
FIG. 2E is an example receiver circuit architecture in which a transimpedance amplifier extracts phase noise in digital difference and relative intensity noise of a laser in digital sum, in accordance with various aspects described herein.

FIG. 2E is an example receiver circuit architecture 230 in which a transimpedance amplifier extracts phase noise in digital difference and relative intensity noise of a laser in digital sum, in accordance with various aspects described herein. As shown in FIG. 2E, the analog chain of the receiver circuit architecture 230 may include a (e.g., silicon photonics) ICR 230_i_, a TIA device 240, and an Rx ASIC 250. In exemplary embodiments, the ICR 230_i_, the TIA device 240, and the Rx ASIC 250 may be integrated with one another to provide overall EPN cancellation. In one or more embodiments, the ICR 230_i_, the TIA device 240, and the Rx ASIC 250 may be monolithically integrated on a single die.

In various embodiments, the ICR 230_i_ may be the same as or similar to (or otherwise correspond to) the ICR 200_a_ of FIG. 2A. For instance, similar to the ICR 200_a_, the ICR 230_i_ in FIG. 2E may include an LO SSC 232_e_ and a balanced receiver 232, where a frequency discriminator 234, comprising a tap 234_p_ (e.g., ~5% tap), splitter(s)/combiner(s) 234_s_ (e.g., MMI or other types), TPSs 234_h_ (which may be driven in a single-ended manner or differentially), a delay 234_y_ (e.g., 16 mm Rib waveguide, although it will be understood that different waveguide dimensions may yield different delay/loss amounts), splitter(s)/combiner(s) 234_t_ (e.g., MMI or other types), and (e.g., balanced) photodetectors 234_d_, may be configured to facilitate detection of a phase of EPN. The photodetectors 234_d_ may be biased by a voltage $V_{PD}$ (which may be fed from a voltage generated on the TIA device 240 or an external source).

The TIA device 240 may include various components arranged to amplify the detected phase of the EPN. In various embodiments, the TIA device 240 may include a parallel arrangement of components corresponding to the outputs of the two photodetectors 234_d_. For instance, as shown in FIG. 2E, the TIA device 240 may include transimpedance amplifiers 240_a_, 241_a_, feedback resistors 240_k_, 241_k_, transformers 240_f_, 241_f_, reference voltage sources 240_v_, 241_v_, direct current (DC) cancellation loops DCCp 240_d_, DCCn 241_d_, manual gain controls (MGCs) 240_m_, 241_m_ (e.g., variable gain amplifiers), and output drivers (ODRs) 240_r_, 241_r_. The gain of each of the MGCs 240_m_, 241_m_ may be set to any of several (e.g., four) gain values via a 2-bit digital control signal ("EPN_TZ<1:0>"). Alternatively, the gain may be set via an analog voltage or driven by a (e.g., 12 bit) digital to analog converter (DAC) to provide higher gain resolution/finesse.

A DC block 245, comprising capacitors 245_c_, 246_c_ (e.g., anywhere from ~1 nano Farad (nF) to ~1 micro Farad (uF), depending on the desired frequency at which to start capturing the phase noise and respond to transients), may also be arranged to couple/decouple outputs of the ODRs 240_r_, 241_r_ and inputs of ADCs 250_a_, 251_a_ of the ASIC 250.

Inherently, the transimpedance amplifiers 240_a_, 241_a_, the MGCs 240_m_, 241_m_, the ODRs 240_r_. 241_r_ may provide a low-pass function, whereas the DCCp 240_d_, DCCn 241_d_ and the DC block 245 may provide a high-pass function, effectively providing a BPF (e.g., the BPF **225*f* of FIG. 2**D).

The ADCs **250*a*, 251*a* may each be configured to sample analog signals and generate digital signals. In certain embodiments, the ADCs may be successive-approximation-register (SAR) ADCs (e.g., 1 GSs). Although the DC block 245 is shown in FIG. 2E as being separate (and possible off-chip or off-die), in alternate embodiments, the DC block 245 may be integrated with or in one of the other devices, such as front ends of the ADCs 250*a* and 251*a*. In some embodiments, the common mode voltage of the ODRs 240*r*. 241*r* may be matched (or near matched) to the common mode voltage of the ADCs 250*a*. 251*a*. In these embodiments, the DC block 245 may or may not be needed. As shown in FIG. 2E, the ASIC 250 may include an interface (e.g., a serial peripheral interface (SPI) master) for outputting data to a digital to analog converter (DAC) 231 for controlling the ICR 230*i* (e.g., the TPSs 234*h*) and/or the TIA device 240. In one or more embodiments, the SPI may output digital commands for setting the output voltage of the DAC 231, driving the TPSs 234*h* to hold the MZ interferometer at quadrature to maximize the signal coming out of the frequency discriminator 234. The power may be detected digitally in the ASIC 250, which may be used to dither the DAC 231 to continuously "hunt" for a maximum detected signal and balance the reported DCCn and DCCp currents, which may be read-back from the TIA (240) ADC. The SPI may output signals to the TIA 240** to control all of the RF channels and/or to control the EPN TIA's MGC "EPN_TZ<1:0>". In some embodiments, the SPI may additionally be able to readback the DCCn and DCCp currents using the on die ADC.

It is expected that $R_P \# R_N$ and thus, the DC value of the P and N paths may be balanced and the common mode rejection ratio (CMRR) of the frequency discriminator may be optimized or improved. That is, if the responsivity of the two photodetectors $FD_P$ and $FD_N$ (**234*d*) are not perfectly balanced (or if optical losses in the P and N paths are not perfectly balanced), then there might be a slight DC value that can be optimized. In such a case, the DCCn 241*d* may be adjusted such that the output of DCCn 241*d* may be made equal (or about equal) to the output of the DCCp 240*d*, where an additional amplifier (not shown) may be included prior to the (–) input of the MGC 240*m*, and where one input of the additional amplifier may take $V_{IntRef}$ 240*v*** and the other input of the additional amplifier may take an output of a DAC (also not shown). In this way, any such (common mode) DC value on the P and N paths may be balanced out. It is to be understood and appreciated that other circuit designs can alternatively be employed to balance such DC values.

Generally speaking, an ADC may sample analog signals periodically at a sample rate that is based on a signal received from a voltage-controlled oscillator (VCO) at the receiver device, and may apply digital signal processing to the digital signals. The digital signal processing may include equalization processing that is designed to compensate for a variety of channel impairments, such as CD, SOP rotation, mean PMD that determines the probability distribution which instantiates as differential group delay (DGD), PDL or PDG, and/or other effects. The digital signal processing may further include carrier recovery processing, which may include calculating an estimate of carrier frequency offset fIF (i.e., the difference between the frequency of the transmitter laser and the frequency of the receiver laser). According to some example implementations, the digital signal processing may further include multiple-input-multiple-output (MIMO) filtering, clock recovery, and FDM subcarrier de-multiplexing. The digital signal processing may include symbol-to-bit demapping (or decoding) using a decision circuit, such that signals resulting from the digital signal processing are representative of bit estimates. Where a received optical signal is representative of symbols comprising FEC-encoded bits generated as a result of applying FEC encoding to client bits, the signals may further undergo FEC decoding to recover the corrected client bits.

In any case, the configuration of FIG. 2E may provide both the above-discussed difference signal P–N, which yields the phase information, $\sin(\theta(t-\tau)-\theta(t))$, and the above-discussed sum signal P+N, which yields the amplitude noise information (or relative intensity noise of the laser), $|E_L|^2$.

Figure 2F:
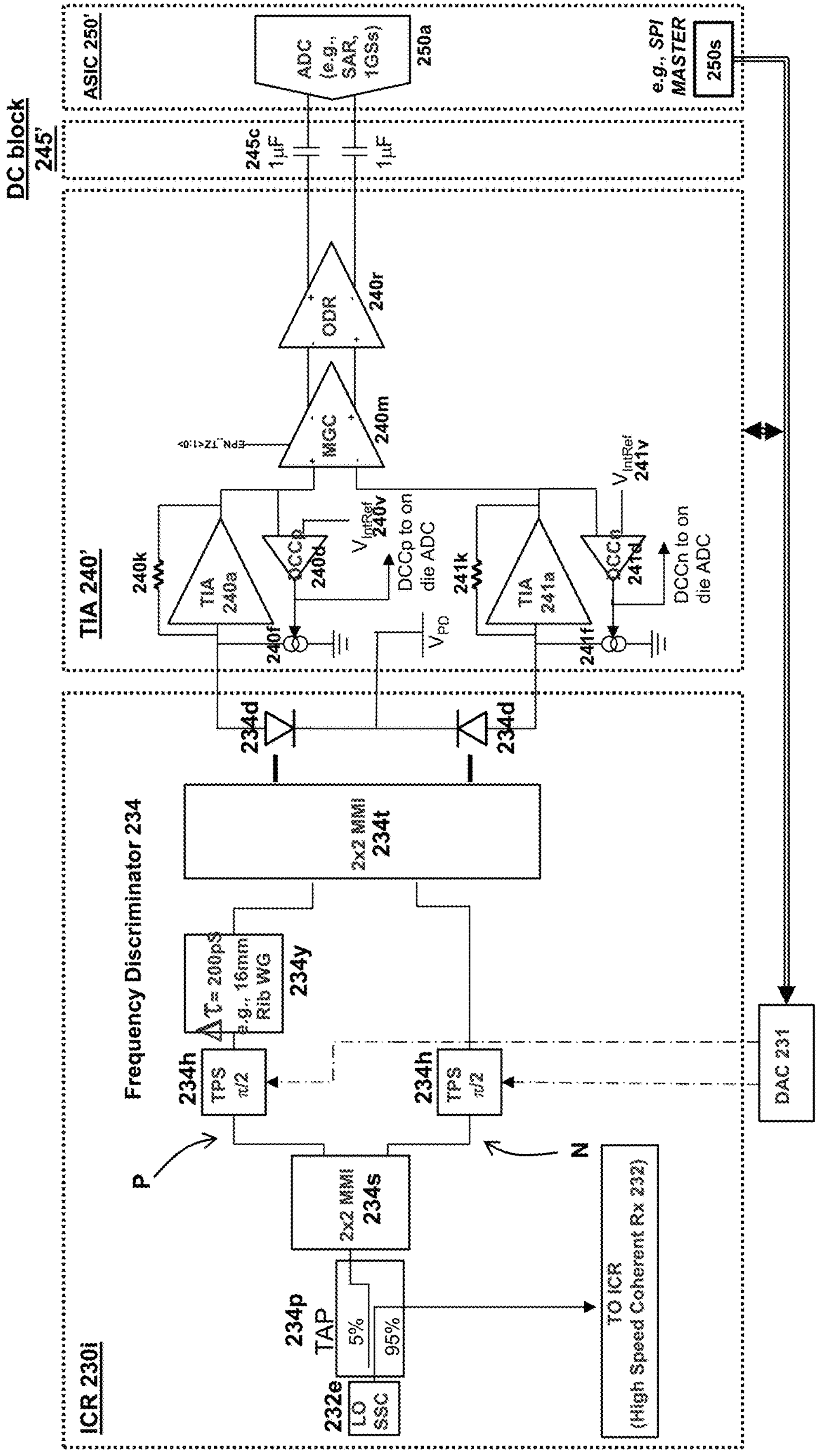
FIG. 2F is an example receiver circuit architecture in which a transimpedance amplifier extracts (e.g., only) phase noise in digital difference, in accordance with various aspects described herein.

FIG. 2F is an example receiver circuit architecture 230' in which a transimpedance amplifier extracts (e.g., only) phase noise in digital difference, in accordance with various aspects described herein. The analog chain of the receiver circuit architecture 230' may include a (e.g., silicon photonics) ICR **230*i*, a TIA device 240', and an Rx ASIC 250'. In various embodiments, the TIA device 240' may be similar to or otherwise correspond to the TIA device 240 of FIG. 2E, and the Rx ASIC 250' may be similar to or otherwise correspond to the Rx ASIC 250 of FIG. 2E. The differences here are that the TIA device 240' may not include MGC 241*m* and ODR 241*r*, the output of the amplifier 241*a* of the TIA device 240' may be additionally fed to an input of the MGC 240*m*, the ASIC 250' may not include ADC 251*a*, and DC block 245' may not include capacitors 246*c*. The configuration of FIG. 2**F may provide the above-discussed difference signal P–N, which yields the phase information, $\sin(\theta(t-\tau)-\theta(t))$, and rejects the amplitude noise information (or relative intensity noise of the laser), $|E_L|^2$.

Figure 2G:
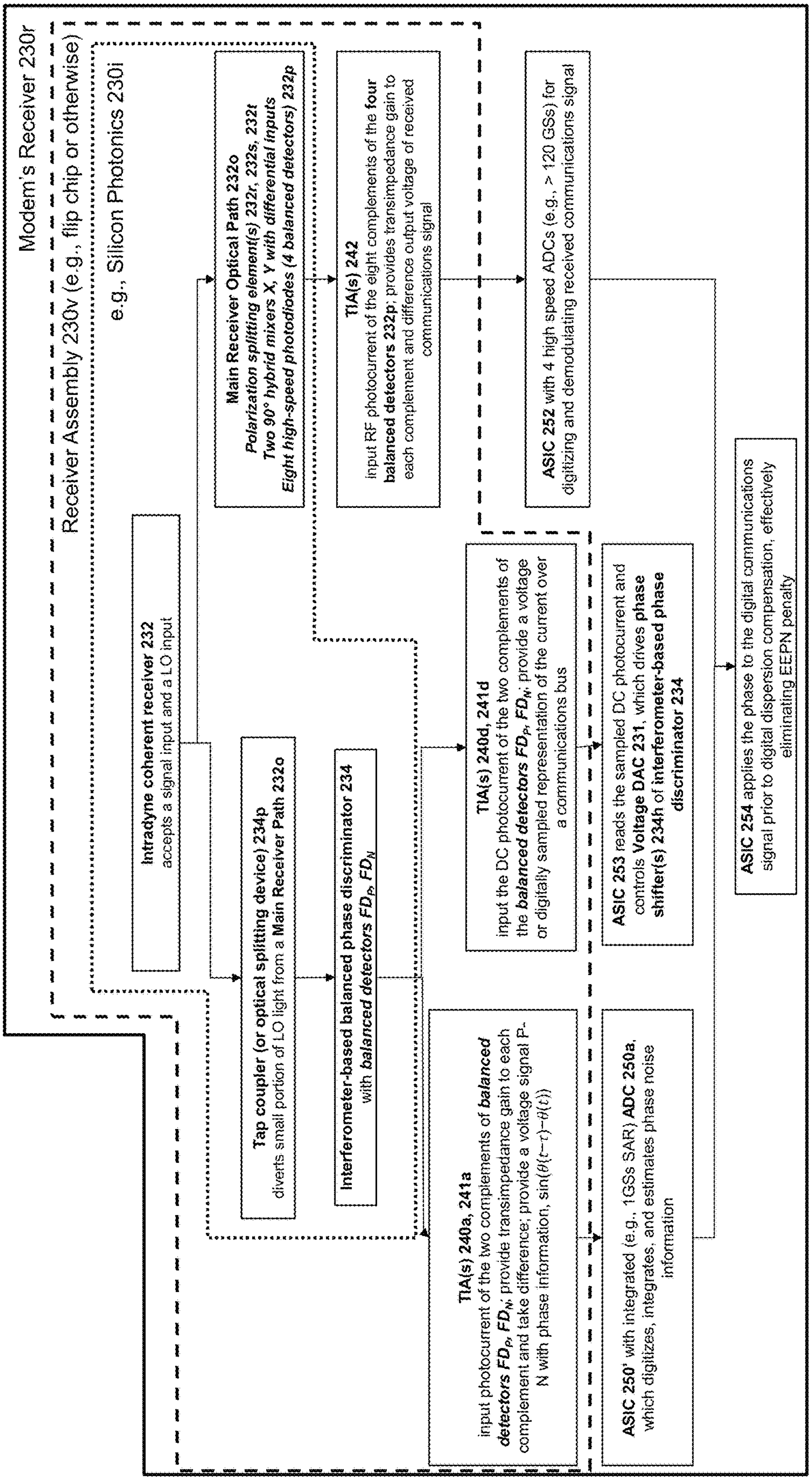
FIG. 2G shows a high-level architecture of a modem receiver with example flows between components, in accordance with various aspects described herein.

FIG. 2G shows a high-level architecture of a modem receiver **230*r* with example flows between components, in accordance with various aspects described herein. As shown in FIG. 2G, the modem receiver 230*r* may include a receiver assembly 230*v* (which may be implemented via flip chip or otherwise). In various embodiments, the modem receiver 230*r* may include or incorporate some or all of the components described above with respect to one or more of FIGS. 2A, 2C, 2D, 2E and 2F. For instance, as shown, the receiver assembly 230*v* may comprise a (e.g., SiP) package 230*i* that includes the ICR 232, the tap coupler 234*p*, the interferometer-based balanced phase discriminator 234 with balanced photodetectors 234*d* ($FD_P$ and $FD_N$), and a main receiver path 2320 with polarization splitting element(s) 232*r*, 232*s*, 232*t* (e.g., similar to or corresponding to 202*r*, 202*s*, 202*t* of FIG. 2A), hybrid mixers X. Y (e.g., similar to optical hybrids X. Y of FIG. 2A), and HSPDs 232*p* (e.g., similar to HSPDs 202*p* of FIG. 2**A).

Additionally, the receiver assembly **230*v* may comprise TIA(s) 242 and an ASIC 252 for amplifying, obtaining a difference of, and digitizing/demodulating signals for the main receive path 2320. Further, the receiver assembly 230*v* may comprise TIA(s) 240*a*, 241*a* as well as ASIC 250' (with ADC 250*a*) for estimating and digitizing the phase noise information. Furthermore, the receiver assembly 230*v* may comprise TIA(s) 240*d*, 241*d* for digital sampling of DC currents (e.g., DCCp, DCCn of FIG. 2F) of the balanced photodetectors 234*d*, and an ASIC 253 that uses such sampling to control the DAC 231 for driving the phase shifters 234*h* of the interferometer-based balanced phase discriminator 234. An ASIC 254 may apply the extracted phase to the digital communications signal of the main receiver path 2320 prior to digital dispersion processing, thereby reducing or eliminating EEPN. It will be understood and appreciated that some or all of the ASICs 250', 252, 253, and 254** may be implemented individually or in a combined manner. For instance, a single ASIC may include multiple ADCs that provide various of the above-described ASIC-related functions.

It is to be understood and appreciated that, although one or more of FIGS. 1 and 2A-2G might be described above as pertaining to various processes and/or actions that are performed in a particular order, some of these processes and/or actions may occur in different orders and/or concurrently with other processes and/or actions from what is depicted and described above. Moreover, not all of these processes and/or actions may be required to implement the systems and/or methods described herein. Furthermore, while various components, devices, systems, modules, circuits, etc. have been illustrated in one or more of FIGS. 2A-2D as separate components, devices, systems, modules, circuits, etc., it will be appreciated that multiple components, devices, systems, modules, circuits, etc. can be implemented as a single component, device, system, module, circuit, etc., or a single component, device, system, module, circuit, etc. can be implemented as multiple components, devices, systems, modules, circuits, etc. Additionally, functions described as being performed by one component, device, system, module, circuit, etc. may be performed by multiple components, devices, systems, modules, circuits, etc., or functions described as being performed by multiple components, devices, systems, modules, circuits, etc. may be performed by a single component, device, system, module, circuit, etc.

The terms "first," "second," "third," and so forth, as used in the claims, unless otherwise clear by context, is for clarity only and does not otherwise indicate or imply any order in time. For instance, "a first determination," "a second determination," and "a third determination," does not indicate or imply that the first determination is to be made before the second determination, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, nonvolatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments. Additionally, functions described as being performed by one component or system may be performed by multiple components or systems, or functions described as being performed by multiple components or systems may be performed by a single component or system, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A device, comprising:

an optical package, wherein the optical package comprises a transmit receive optical silicon integrated circuit (TROSiC) package with a balanced receiver and a quad parallel Mach-Zehnder (QPMZ) modulator;

a frequency discriminator configured to provide complementing signals that include phase noise associated with a local oscillator (LO) input, wherein the LO input is split between the balanced receiver and the QPMZ modulator;

a transimpedance amplifier (TIA) system adapted to provide one or more phase information signals by amplifying a difference of the complementing signals; and an application specific integrated circuit (ASIC) configured to process the one or more phase information signals to derive an estimation of the phase noise, wherein the frequency discriminator is implemented in the optical package and integrated with the TIA system and the ASIC to facilitate avoidance of enhanced equalized phase noise (EEPN).

2. The device of claim 1, wherein the frequency discriminator, the TIA system, and the ASIC are monolithically integrated on a same die.

3. The device of claim 1, wherein the frequency discriminator feeds from a tap coupler on a LO input path in the optical package.

4. The device of claim 1, wherein the frequency discriminator is interferometer-based.

5. The device of claim 1, wherein the frequency discriminator comprises a delay element arranged in one of two paths, resulting in a delayed path and a non-delayed path.

6. The device of claim 1, wherein the frequency discriminator comprises a splitter device that manipulates a portion of the LO input for output onto two paths.

7. The device of claim 6, wherein a ratio of the splitter device is other than 50/50.

8. The device of claim 1, wherein the frequency discriminator comprises one or more phase shifters for controlling phase in two paths.

9. The device of claim 1, wherein the frequency discriminator comprises a combiner device that couples a delayed path and a non-delayed path to a pair of balanced photodetectors.

10. The device of claim 9, wherein a ratio of the combiner device is 50/50.

11. The device of claim 1, wherein the complementing signals comprise an inverting signal and a non-inverting signal.

12. The device of claim 1, wherein the ASIC or another ASIC of the device is configured to:

digitize the estimation of the phase noise, resulting in a digitized estimation; and process a digital conversion of a received signal with the digitized estimation prior to performing digital dispersion compensation so as to reduce or eliminate the EEPN.

13. The device of claim 1, wherein the ASIC comprises a successive-approximation-register (SAR) analog to digital converter (ADC).

14. The device of claim 1, further comprising a second TIA system adapted to provide a voltage signal or a digitally sampled representation of the voltage signal for use by the ASIC or another ASIC to drive phase shifters of the frequency discriminator.

15. The device of claim 1, wherein the complementing signals further include relative intensity noise associated with the LO input, wherein the TIA system is further adapted to provide one or more relative intensity noise information signals by amplifying a sum of the complementing signals, and wherein the ASIC or another ASIC is configured to process the one or more relative intensity noise information signals to derive an estimation of the relative intensity noise.

16. A noise cancellation system for facilitating avoidance of enhanced equalized phase noise (EEPN), the noise cancellation system comprising:

a frequency discriminator configured to provide complementing signals that include phase noise associated with a local oscillator (LO) input;

a transimpedance amplifier (TIA) system adapted to provide one or more phase information signals by amplifying a difference of the complementing signals; and an application specific integrated circuit (ASIC) configured to process the one or more phase information signals to derive an estimation of the phase noise, wherein the frequency discriminator is implemented in an optical package and integrated with the TIA system and the ASIC, and wherein the ASIC or another ASIC is configured to digitize the estimation of the phase noise, resulting in a digitized estimation, and process a digital conversion of a received signal with the digitized estimation prior to performing digital dispersion compensation so as to reduce or eliminate the EEPN.

17. The noise cancellation system of claim 16, wherein the frequency discriminator is interferometer-based.

18. A method, comprising:

implementing a frequency discriminator in an optical package, the frequency discriminator being configured to provide complementing signals that include phase noise and relative intensity noise associated with a local oscillator (LO) input; and integrating a transimpedance amplifier (TIA) system and an application specific integrated circuit (ASIC) with the frequency discriminator to facilitate avoidance of enhanced equalized phase noise (EEPN), wherein the TIA system is adapted to provide one or more phase information signals by amplifying a difference of the complementing signals and to provide one or more relative intensity noise information signals by amplifying a sum of the complementing signals, and wherein the ASIC is configured to process the one or more phase information signals to derive an estimation of the phase noise and to process the one or more relative intensity noise information signals to derive an estimation of the relative intensity noise.

19. The method of claim 18, wherein the optical package comprises a silicon photonics (SiP) intradyne coherent receiver (ICR) package with a balanced receiver.

20. The method of claim 18, wherein the complementing signals comprise an inverting signal and a non-inverting signal.

* * * * *